(12) United States Patent
Yanase et al.

(10) Patent No.: US 7,811,691 B2
(45) Date of Patent: Oct. 12, 2010

(54) FUEL CELL SYSTEM

(75) Inventors: Norimasa Yanase, Chiba (JP);
Fumiharu Iwasaki, Chiba (JP);
Kazutaka Yuzurihara, Chiba (JP);
Tsuneaki Tamachi, Chiba (JP);
Takafumi Sarata, Chiba (JP); Toru Ozaki, Chiba (JP)

(73) Assignee: Seiko Instruments Inc. (JP)

( * ) Notice: Subject to any disclaimer, the term of this patent is extended or adjusted under 35 U.S.C. 154(b) by 1429 days.

(21) Appl. No.: 11/216,392

(22) Filed: Aug. 31, 2005

(65) Prior Publication Data

US 2006/0057447 A1 Mar. 16, 2006

(30) Foreign Application Priority Data

Sep. 16, 2004 (JP) ............... 2004-270401
Jul. 1, 2005 (JP) ............... 2005-193759

(51) Int. Cl.
*H01M 8/04* (2006.01)
(52) U.S. Cl. ......................... 429/23; 429/22
(58) Field of Classification Search ............ 429/23, 429/13, 22, 24, 25, 17, 20, 7, 11, 12
See application file for complete search history.

(56) References Cited

U.S. PATENT DOCUMENTS

| 6,472,090 | B1 | 10/2002 | Colbow et al. |
| 6,692,851 | B2 * | 2/2004 | Keskula et al. ............ 429/13 |
| 7,157,164 | B2 * | 1/2007 | Nakanishi et al. ............ 429/12 |
| 2003/0211372 | A1 | 11/2003 | Adams |
| 2004/0137293 | A1 | 7/2004 | Nakanishi |

FOREIGN PATENT DOCUMENTS

| DE | 10055291 A1 | 5/2001 |
| EP | 1263070 A2 | 12/2002 |

* cited by examiner

*Primary Examiner*—Jennifer Michener
*Assistant Examiner*—Monique Wills
(74) *Attorney, Agent, or Firm*—Adams & Wilks

(57) ABSTRACT

To provide a small-sized fuel cell system capable of providing a mode having a simple constitution preventing power generation of a fuel cell in an overload state, preventing a deterioration in the fuel cell system and providing a stable output from the fuel cell in the fuel cell system constituting a power source by the fuel cell. Overload states of all of single cells constituting a fuel cell are detected and an output of the fuel cell is controlled such that when the overload state is detected, the output of the fuel cell is cut or a cell in the overload state is recovered to a normal power generating state.

6 Claims, 10 Drawing Sheets

30 CURRENT RESTRICTING MEANS

FUEL CELL SYSTEM

BACKGROUND OF THE INVENTION

1. Field of the Invention

The present invention relates to a fuel cell system, particularly relates to a fuel cell system devised to be useful as a power source of a small-sized electronic apparatus of a portable apparatus or the like by preventing a deterioration in a single cell of a fuel cell by polarization reversal or overload.

2. Description of the Related Art

In recent years, power consumption of a portable apparatus represented by a portable telephone is more and more increased in accordance with high function formation of the apparatus and an increase in a capacity of a power source poses a serious problem. Under such a situation, attention is attracted to a fuel cell as a small-sized energy power source having a high energy density.

A fuel cell is constituted by interposing an electrolyte by two kinds of electrodes, and electricity is generated by oxidizing a fuel of a hydrogen or methanol or the like by a fuel pole and reducing oxygen in the atmosphere by an oxygen pole. In fuel cells, a solid polymer type fuel cell (PEFC) is expected to be applied as a power source for a portable apparatus since the cell is capable of power generation at around room temperature provided with a high output density and can be downsized.

When a fuel cell is used as a power source, a practical operating voltage of a single cell of the fuel cell is around 0.5V. Hence, in order to produce a practical voltage necessary for a load, a predetermined high output voltage is produced by connecting a necessary number of the single cells in series.

Although in this way, by connecting the single cells of the fuel cell in series, a fuel cell having a high voltage and a high output can be provided, when the plurality of single cells are connected in series to use, there poses a problem that a power generating function of the fuel cell as an assembly of the single cells is deteriorated owing to a variation in an output of each single cell. Because a single cell having the lower power generating function constitutes a resistance component to reduce the output of the fuel cell. Therefore, in order to restrain a variation in outputs of respective single cells, there is proposed a fuel cell devised to control a fuel supplying method by using auxiliaries or the like (refer to. for example, JP-A-06-103998 page 3, FIG. 1)

PROBLEMS THAT THE INVENTION IS TO SOLVE

A fuel cell is provided with a load response lower than that of a primary cell or a secondary cell or the like and in accordance with an increase in a load current, voltage drop by various overvoltages (activation overvoltage, resistance overvoltage, diffusion overvoltage) is brought about. Further, even when a load current value is constant, a width of a variation in the voltage of an output voltage from a fuel cell is larger than those of the primary cell, the secondary cell and the like. Particularly, in a power generating region in which an influence of voltage drop of the fuel cell voltage by the diffusion overvoltage becomes significant, a rate of voltage drop as compared with an increase in the load current is large.

Application of a load in a overload state of a fuel cell having such a characteristic causes to deteriorate the fuel cell such that polarization reversal is brought about in the fuel cell or the like, which is not preferable.

Incidentally, only a control of supplying a fuel constituting a background art method cannot deal with an abrupt increase in a load in starting the fuel cell or in supplying power to an external load. Under such a state, a single cell having a low power generating function is forced to be operated under an overload state and when the fuel cell continues to generate power in a state in which the single cell operated under the overload state is present, in the single cell operated under the overload state, a deterioration in the function by a deterioration in an electrolyte film, dissolution, coagulation or the like of a catalyst metal is brought about. As a result, an output of a fuel cell system utilizing the fuel cell including the single cell is reduced.

Further, as a fuel cell system for a small-sized electronic apparatus of a portable apparatus or the like, a fuel cell system of the above-described type of supplying fuel is not suitable since an apparatus for supplying the fuel become large-sized. Particularly, a power source of a small-sized portable apparatus is limited in a dimension thereof and requested to be light-weighted and small-sized and therefore, it is important that the fuel cell system is a fuel cell system achieving a stable output from the fuel cell by preventing power generation under the overload state of the fuel cell and preventing a deterioration in the fuel cell system without using auxiliaries requiring a volume.

SUMMARY OF THE INVENTION

In view of the above-described background art, it is an object of the invention to provide a fuel cell system capable of effectively preventing polarization reversal or overload operation of respective single cells connected in series to constitute a fuel cell and realizing to recover functions of the respective single cells.

A first mode of the invention for achieving the above-described object is characterized in comprising a fuel cell constituted by connecting at least 2 pieces of single cells in series, and protecting means for cutting an output of the fuel cell based on a polarization reversal or overload state signal indicating a polarization reversal or overload state when the polarization reversal or overload state is detected continuously for a constant time period or longer by abnormality detecting means for detecting power generation of the respective single cells in the polarization reversal or overload state.

According to the mode, the output of the fuel cell is cut at a time point of detecting polarization reversal or overload of the single cell by the abnormality detecting means and therefore, a deterioration in the single cell brought into the polarization reversal or overload state can be prevented beforehand. Further, according to the mode, after detecting the polarization reversal or overload state, the output is cut after a predetermined time period and therefore, operation of cutting the output can firmly be carried out only when needed while accurately detecting the polarization reversal or overload state by removing an influence of a chattering phenomenon.

Particularly, a fuel cell is provided with a characteristic that a load response thereof is lower than that of a primary battery, a secondary battery or the like, at the same time, voltage drop by various overvoltages (activation overvoltage, resistance overvoltage, diffusion overvoltage) is brought about in accordance with an increase in a load current, and even when a load current value is constant, a width of a variation in an output voltage from the fuel cell is wider than that of the primary battery or the secondary battery. Hence, it is important in view of effectively utilizing the output of the fuel cell to guarantee stable operation of the protecting means by interposing a delay element in consideration of the load response of the fuel cell.

A second mode of the invention is characterized in comprising a fuel cell constituted by connecting at least 2 pieces of single cells in series, protecting means for transmitting a polarization reversal or overload state signal indicating a polarization reversal or overload state when the polarization reversal or overload state is detected continuously for a constant time period or longer by abnormality detecting means for detecting power generation of the respective single cells in the polarization reversal or overload state, and current restricting means started to operate by receiving the polarization reversal or overload state signal for controlling to gradually reduce an output current of the fuel cell.

According to the mode, the output current of the fuel cell can be restricted at a time point of detecting polarization reversal or overload of the single cell by the abnormality detecting means and therefore, a deterioration in the single cell brought into the polarization reversal or overload state can be prevented beforehand. At the same time, supply of the current can be continued although the current is restricted. Further, according to the mode, after detecting the polarization reversal or overload state, a current is restricted after a predetermined time period and therefore, the current restricting operation can firmly be carried out only when needed while accurately detecting the polarization reversal or overload state by removing an influence of a chattering phenomenon.

A third mode of the invention is characterized in comprising a fuel cell constituted by connecting at least 2 pieces of single cells in series, protecting means for cutting an output of the fuel cell based on a polarization reversal or overload state signal indicating a polarization reversal or overload state when the polarization reversal or overload state is detected by abnormality detecting means for detecting power generation of the respective single cells in the polarization reversal or overload state, and output recovering means started to operate by receiving the polarization reversal or overload state signal for recovering an output of the fuel cell.

According to the mode, a measure of recovering the output of the fuel cell can be carried out while cutting the output of the fuel cell similar to the first mode.

A fourth mode of the invention is characterized in comprising a fuel cell constituted by connecting at least 2 pieces of single cells in series, protecting means for transmitting a polarization reversal or overload state signal indicating a polarization reversal or overload state when the polarization reversal or overload state is detected by abnormality detecting means for detecting power generation of the respective single cells in the polarization reversal or overload state, current restricting means started to operate by receiving the polarization reversal or overload state signal for controlling to gradually reduce an output current of the fuel cell, and output recovering means started to operate by receiving the polarization reversal or overload state signal for recovering an output of the fuel cell.

According to the embodiment, the measure of recovering the output of the fuel cell can be carried out while restricting the current similar to the second mode.

A fifth mode of the invention is characterized in that the polarization reversal of overload state signal is formed by constituting a condition that the polarization reversal or overload state is detected continuously for a constant time period or longer by the abnormality detecting means in the third or the fourth mode.

According to the mode, after detecting the polarization reversal or overload state, the output is cut or the current is restricted in the third or the fourth mode after a predetermined time period and therefore, necessary operation of cutting the output or restricting the current can firmly be carried out only when needed while accurately detecting the polarization reversal or overload state by removing the influence of the chattering phenomenon.

A sixth mode of the invention is characterized in that the output recovering means executes a recovery measure for only the single cell in which the polarization reversal or overload state is detected in any one of the third through the fifth modes.

According to the embodiment, the measure of recovering each single cell is carried out. As a result, a processing operation required for the recovering measure is minimized.

A seventh mode of the invention is characterized in that the output recovering means executes a recovery measure by constituting an object by all of the single cells constituting the fuel cell including the single cell in which the polarization reversal or overload state is detected in any one of the third through the fifth modes.

According to the mode, an integral recovering measure is carried out for a total of the fuel cell. As a result, states of the respective single cells can be made to be uniform and the output of the single cell in which polarization reversal or overload is not detected is increased.

An eighth mode of the invention is characterized in that the protecting means includes switching means for shortcircuitting both terminals of the respective single cells and shortcircuits the both terminals of the single cell brought into the polarization reversal or overload state by the switching means when the polarization reversal or overload state is detected in any one of the third through the seventh modes.

According to the embodiment, the single cell in which the polarization reversal or overload is detected is bypassed by the switching means, and recovery of the polarization reversal or overload state can be achieved while supplying the current to remaining cells connected in series.

A ninth mode of the invention is characterized in that the output recovering means removes water generated at a vicinity of an electrode of the single cell in any one of the third through the eighth modes.

As one of basic causes of polarization reversal or overload, it is conceivable that supply of a fuel or oxygen is insufficient for the load. There is a case in which not only water generated at a vicinity of an electrode hampers supply of oxygen but also the generated water hampers supply of the fuel to the fuel pole by inversely diffusing through the electrolyte film. Thereby, oxygen and the fuel become deficient relative to the load. Therefore, the function of the single cell brought into the polarization reversal or overload state can be recovered by removing water on the electrode.

According to the mode, water generated at a vicinity of the electrode can be removed and therefore, the function of the single cell brought into the polarization reversal or overload state can be recovered.

A tenth mode of the invention is characterized in that the protecting means determines the polarization reversal or overload state when a voltage across the both terminals of each of the single cells is equal to or smaller than a predetermined value in any one of the first through the ninth modes.

Polarization reversal refers to reversal of the output voltage of the single cell constituting the fuel cell. That is, polarization reversal refers to a state in which a negative voltage is detected from the positive pole when a reference is constituted by the negative pole. Further, overload refers to a state in which in an output characteristic of a fuel cell, power is generated at a region in which a rate of reducing the output voltage of the fuel cell is increased in accordance with the increase in the output current of the fuel cell. Specifically, the overload refers to a power generating region in which the voltage of the single cell of the fuel cell becomes equal to or smaller than a voltage value of 65% of operation voltage of the single cell.

According to the mode, an abnormality of the generated power voltage can be detected by detecting the voltage across the both terminals of each single cell.

An eleventh mode of the invention is characterized in that the protecting means determines the polarization reversal or overload state when a temperature of the electrode of each of the single cells is equal to a predetermined value or higher in any one of the first through the ninth modes.

In a fuel cell system in which a temperature of a single cell or a fuel is not controlled, the fuel cell is not heated or cooled and therefore, there is established a relative relationship between heat generated by power generation and the output of the fuel cell. Therefore, it is not necessary to humidify or heat a fuel or heat the cell in making the fuel flow, which is particularly effective for a passive type fuel cell system capable of grasping the output of the fuel cell by detecting heat generated by the fuel cell and an abnormality in the generated power voltage can be detected by detecting the temperature of the single cell.

A twelfth mode of the invention is characterized in that the protecting means further includes counting means for counting a number of times of bringing the respective cells into the polarization reversal or overload state and cuts the output of the fuel cell when polarization reversal or overload of the same single cell is detected continuously by a specified number of times or more in any one of the first through the eleventh modes.

According to the mode, by controlling a number of times of continuously detecting the polarization reversal or overload state, an operation efficiency of the fuel cell system is maintained as high as possible and at the same time, by cutting the output of the fuel cell in accordance with detection of the polarization reversal or overload state, the single cell brought into the polarization reversal or overload state can pertinently be protected.

A thirteenth mode of the invention is characterized in that the current controlling means controls to gradually reduce the output current from a maximum output current of the fuel cell in the second or the fourth mode.

According to the embodiment, the current is rationally restricted and in recovery, the maximum output current of the fuel cell can be provided.

A fourteenth embodiment of the invention is characterized in that the current restricting means controls to gradually reduce the output current from the maximum output current of the fuel cell, while when recovery of the fuel cell to a normal state which is not the polarization reversal or overload state is detected in the midst of gradually reducing the output current, the current restricting means fixes a value of the output current to an output current value at a time point of the recovery, when the current restricting means receives the polarization reversal or overload signal again, the current restricting means repeats to control similarly to further gradually reduce the output current in the thirteenth mode.

According to the mode, while the function of the fuel system is maintained at a maximum limit, rational current restriction for preventing a deterioration in the single cell in which the polarization reversal or overload state is detected can be realized.

A fifteenth mode of the invention is characterized in further comprising current detecting means for detecting the output current supplied to an external load, wherein the current restricting means is constituted to operate to reset at a time point of nullifying the output current detected by the current detecting means in the second, the fourth, the thirteenth or the fourteenth mode.

According to the mode, operation of the current restricting means is reset by detecting that there is not a necessity of restricting the current by nullifying the output current and therefore, the current can smoothly be supplied to succeeding external load.

ADVANTAGE OF THE INVENTION

According to the invention, power generation in the polarization reversal or overload state of the fuel cell in starting the fuel cell, by an abrupt increase in the load in supplying power to the external load or a state of being deficient in the fuel can be prevented in a state of maintaining the operation efficiency of the fuel cell system at the efficiency as high as possible and therefore, prevention of power generation in the mode of deteriorating the fuel cell and initial power generation function of the single cell of the fuel cell are maintained, as a result, service life of the fuel cell system can be prolonged without deteriorating the operation efficiency.

Further, when combined with the pertinent recovery measure or when output cutting or current restricting operation in consideration of the number of times of continuously bringing about the polarization reversal or overload state is constituted, a total operation efficiency can further be promoted.

BEST MODE FOR CARRYING OUT THE INVENTION

An embodiment of the invention will be explained in details in reference to the drawings as follows.

Generally, when a solid polymer type fuel cell (PEFC) is used as a fuel cell, hydrogen is stored by means of at least one kind or more of a group consisting of a high pressure bomb, hydrogen absorbing amorphous alloy, a carbon material of carbon nanotube or fullerene and the like in any state of liquid hydrogen, hydrogen gas, or hydrogen atom. On the other hand, it is also possible to output hydrogen by subjecting a chemical substance including hydrogen of alcohol, inorganic chemical hydride, an organic chemical hydride and the like to a chemical change of reforming or hydrolysis.

On the other hand, when using a fuel cell of a fuel direct type represented by a direct methanol type fuel cell (DMFC), methanol is used as a fuel. Further, dimethyl ether (DME), alcohols of 2-propanol, ethanol and the like can also be used in place of methanol. Further, as a fuel of a fuel cell of a fuel direct type, an aqueous solution of a metal hydrogen complex of sodium boron hydride or the like can be used.

The invention is applicable to any type of a fuel cell.

DESCRIPTION OF THE PREFERRED EMBODIMENTS

A first embodiment is for particularly preventing operation in a polarization reversal state of a single cell constituting a fuel cell and is constituted to cut an output of a fuel cell when the polarization reversal state is detected.

Figure 1:
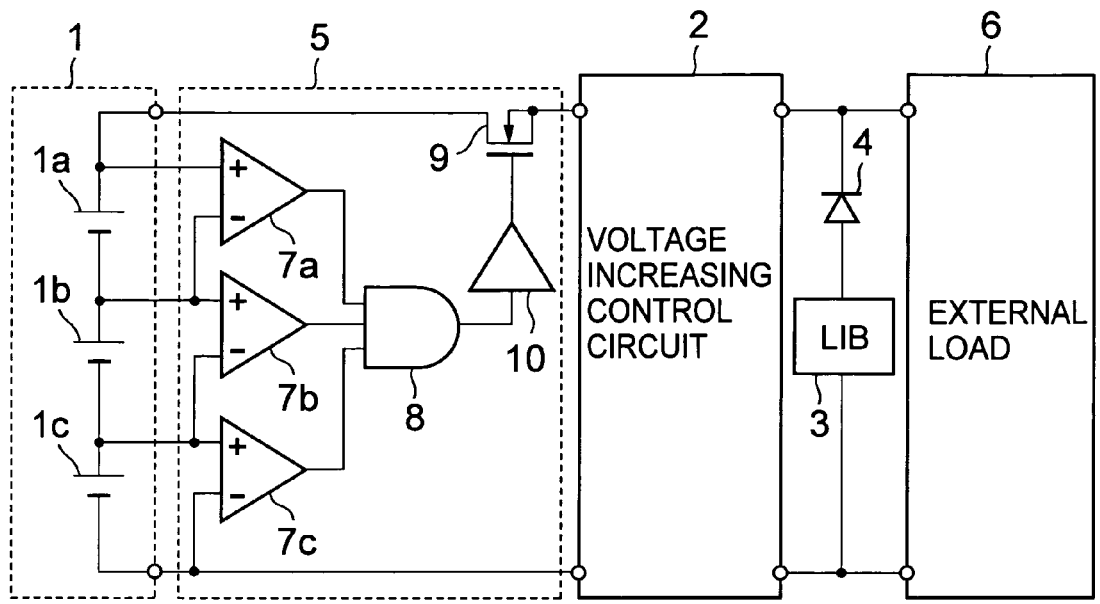
FIG. 1 is a block diagram of a fuel cell power source system according to a first embodiment of the invention.

As shown by FIG. 1, the fuel cell system is constructed by a constitution comprising a fuel cell 1 of PEFC capable of outputting power from a fuel by chemical reaction as a power source, a voltage increasing control circuit 2 for increasing a voltage of an output of the fuel cell 1 as a voltage increasing and reducing control circuit, a lithium ion secondary battery 3 (hereinafter, abbreviated as LIB3) of 2 cells having a capacity of 400 mAh and a nominal voltage of 8.4 V as an electricity storage element, a Schottky diode 4 for preventing flow back of a current of LIB3, and a protecting circuit 5 for preventing operation of the fuel 1 in a polarization reversal or overload state for supplying power to an external load 6.

The fuel cell 1 is constituted by connecting 3 pieces of single cells 1a, 1b, 1c of the fuel cell in series. Further, an open circuit voltage of the fuel cell 1 is set to 2.93 V. An output voltage value of the voltage increasing control circuit 2 is set to 8.5 V. An electronic load apparatus of direct current is connected to the external load 6.

The protecting circuit 5 includes 3 pieces of comparators 7a, 7b, 7c for respectively comparing voltages across both terminals of the respective single cells 1a, 1b, 1c and a 3 inputs AND gate logical circuit 8, N-chMOSFET 9 for switching an output of the fuel cell 1, and a driving circuit 10 having a delay operation function for driving N-chMOSFET 9.

Here, as the protecting circuit 5 according to the embodiment is for detecting power generation particularly in a polarization reversal state, reverted (inverted) input terminals of the respective comparators 7a, 7b, 7c are directly connected with fuel poles of the respective single cells 1a, 1b, 1c and unreverted (non-inverted) input terminals thereof are connected with oxygen poles of the respective single cells 1a, 1b, 1c. Outputs of the respective comparators 7a, 7b, 7c are supplied to the AND gate logical circuit 8 of n inputs.

According to the delay operation, when a polarization reversal or overload state signal indicating the polarization reversal or overload state is generated (actually, a change in a state of a state signal), a result is reflected when a value thereof is held for 5 seconds. By interposing the delay operation, the polarization reversal or overload state can be detected accurately by removing an influence of a chattering phenomenon.

Further, electronic elements used in the voltage increasing control circuit 2 and the protecting circuit 5 are supplied with power from LIB3 constituting the electricity storing element. As the electricity storing element, at least one of a group consisting of a secondary cell, a capacitor, a condenser and the like can arbitrarily be selected. As a secondary cell, at least one of a group consisting of a lithium ion secondary cell, a lithium polymer secondary cell, a metal lithium secondary cell, a nickel hydrogen secondary cell, a nickel cadmium secondary cell, a nickel iron secondary cell, a nickel zinc secondary cell, a silver oxide zinc secondary cell, a zinc halogen secondary cell, a lead storage cell, a redox flow cell, a sodium sulfur cell and the like can arbitrarily be selected.

In the fuel cell system according to the embodiment having the above-described constitution, when all of the single cells 1a, 1b, 1c of the fuel cell 1 normally generate power, respective outputs of the comparators 7a, 7b, 7c become outputs of H level. The respective H level outputs of the comparators 7a, 7b, 7c are inputted to the 3 inputs AND gate logical circuit 8 and therefore, an output of the 3 inputs AND gate logical circuit 8 becomes H level. As a result, the driving circuit 10 turns on N-chMOSFET 9 to input the output of the fuel cell 1 to the voltage increasing control circuit 2. In this way, power can be outputted to the external load 6 via the voltage increasing control circuit 2.

On the other hand, when at least 1 piece of the single cells 1a, 1b, 1c of the fuel cell 1 is brought into the polarization reversal state, a negative voltage is outputted from the single cell 1a, 1b, 1c of the fuel cell 1 and an output of any one of the comparators 7a, 7b, 7c connected to a cell of the single cells 1a, 1b, 1c brought into the polarization reversal state becomes L level. As a result, there is brought about a state in which all of signal levels inputted to the 3 inputs AND gate logical circuit 8 are not at H level, and the output of the 3 inputs AND gate logical circuit 8 becomes L level. When the output level of the 3 inputs AND gate logical circuit 8 is continued for 5 seconds or longer, the driving circuit 10 makes N-chMOSFET 9 OFF. Thereby, the output of the fuel cell 1 is cut. In this way, power generation in the polarization reversal state is prevented. After cutting the output of the fuel cell 1, necessary power is supplied to the external load 6 by way of LIB3 constituting the electricity storing element.

Further, the fuel cell 1 is provided with a characteristic that load response is lower than that of a primary cell or a secondary cell or the like, at the same time, in accordance with an increase in a load current, voltage drop by various overvoltages is produced, and a width of a variation in an output voltage from the fuel cell is wider than those of the primary cell, the secondary cell or the like even when a load current valve is constant. Hence, it is important from a view point effectively utilizing the output of the fuel cell 1 to guarantee stable operation of the fuel cell 1 by interposing the driving circuit 10 constituting a delay element in consideration of the load response of the fuel cell 1 in the protecting circuit 5.

A Second embodiment is for preventing operation particularly in an overload state of a single cell constituting the fuel cell and is constituted to cut the output of the fuel cell when the overload state is detected. That is, the embodiment differs from the first embodiment shown in FIG. 1 in a structure of inputting to the reverted input terminals of the comparators 7a, 7b, 7c and otherwise constructed by a constitution similar to that of the first embodiment. Hence, portions the same as those of FIG. 1 are attached with the same numerals and a duplicated explanation thereof will be omitted.

Figure 2:
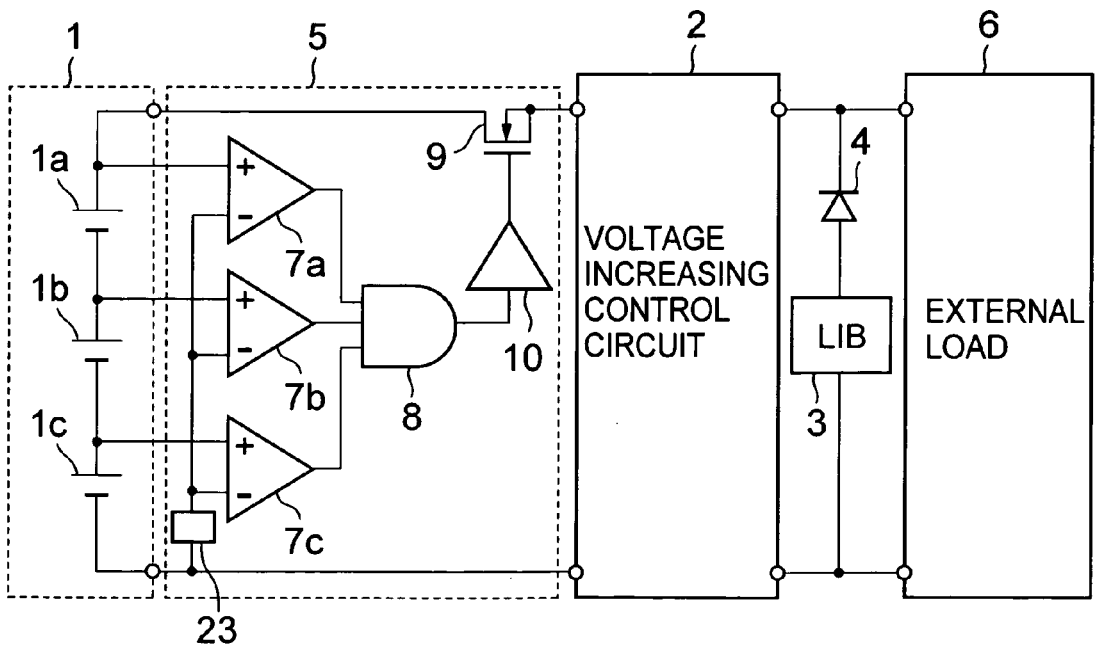
FIG. 2 is a block diagram of a fuel cell power source system according to a second embodiment of the invention.

As shown by FIG. 2, the reverted input terminals of the comparators 7a, 7b, 7c are connected to GND via a reference voltage generator 23. According to the embodiment, a reference voltage of the reference voltage generator 23 is set to 0.3 V in order to prevent power generation at 0.3 V or lower in consideration that a single cell voltage at which an influence of voltage drop by a diffusion overvoltage of the fuel cell 1 is started to be effected significantly is 0.3 V. Further, although the unreverted input terminal of the comparator 7a is superposed with voltages of the single cells 1b, 1c and the unreverted input terminal of the comparator 7b is superposed with a generated voltage of the single cell 1c, an influence of the superposed voltages is removed by constituting to be able to detect the voltages under the same condition by processings in the respective comparators 7a, 7b.

In such a fuel cell system, when all of the single cells 1a, 1b, 1c of the fuel cell 1 generate power by voltages of 0.3 V or higher, the outputs of the respective comparators 7a, 7b, 7c becomes H level. The respective H level outputs of the comparators 7a, 7b, 7c are inputted to the 3 inputs AND gate logical circuit 8 and therefore, the output of the 3 inputs AND gate logical circuit 8 becomes H level. As a result, the driving circuit 10 turns on N-chMOSFET 9 to input the output of the fuel cell 1 to the voltage increasing control circuit 2. In this way, power can be applied to the external load 6 via the voltage increasing control circuit 2.

On the other hand, when at least 1 piece of the single cells 1a, 1b, 1c of the fuel cell 1 becomes equal to or lower than 0.3 V, the output of the comparator 7a, 7b, 7c connected to a cell of the single cells 1a, 1b, 1c of the fuel cell 1 brought into the overload state becomes L level. As a result, there is brought about a state in which all of the signal levels inputted to the 3 inputs AND gate logical circuit 8 are not H level and the output of the 3 inputs AND gate logical circuit 8 becomes L level. When the output level of the 3 inputs AND gate logical circuit 8 is continued for 5 seconds or longer, the driving circuit 10 makes N-chMOSFET 9 OFF. Thereby, the output of the fuel cell 1 is cut. In this way, power generation in the overload state is prevented.

A third embodiment is for preventing operation particularly in the polarization reversal state of the single cell constituting the fuel cell and is constituted to restrict an output current of the fuel cell when the polarization reversal state is detected. That is, whereas according to the first embodiment shown in FIG. 1, the output of the fuel cell 1 is cut by detecting the polarization reversal state, according to the embodiment, the output current of the fuel cell 1 is restricted under a similar condition. Therefore, a number of constituent elements thereof are the same as those of the first embodiment shown in FIG. 1. Hence, portions thereof the same as those of FIG. 1 are attached with the same numerals and a duplicated explanation thereof will be omitted.

Figure 3:
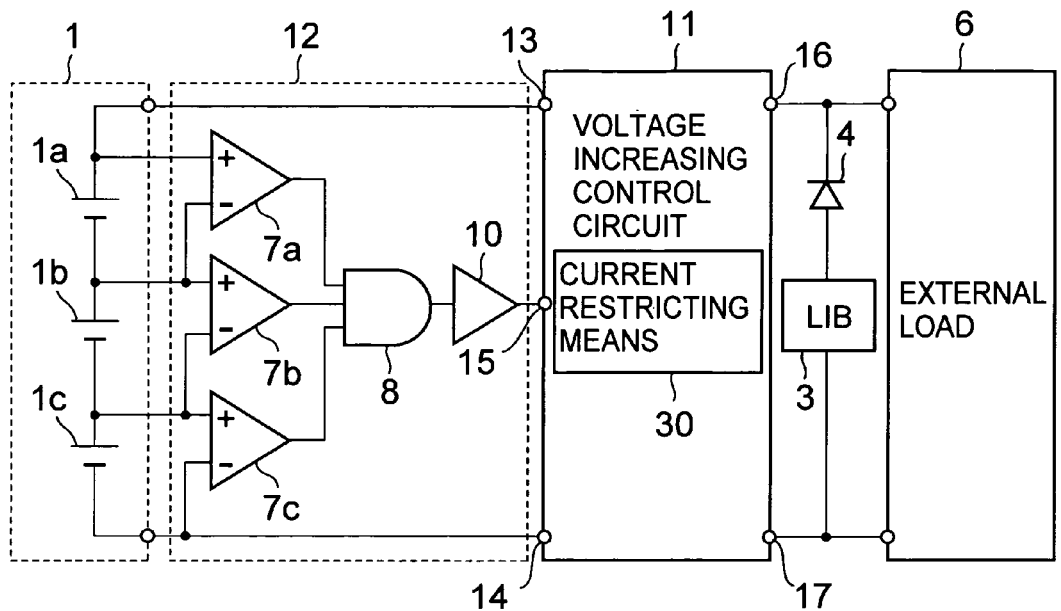
FIG. 3 is a block diagram of a fuel cell power source system according to a third embodiment of the invention.

As shown by FIG. 3, the protecting circuit 12 is constituted by constituted by 3 pieces of the comparators 7a, 7b, 7c, the 3 inputs AND gate logical circuit 8 and the driving circuit 10 having a delay operation function. That is, even when the polarization reversal state is detected, the output of the fuel cell 1 is not cut. A polarization reversal signal indicating the polarization reversal state constituting the output of the protecting circuit 12 is inputted to a control terminal 15 of a voltage increasing control circuit 11. The voltage increasing control circuit 11 includes current restricting means 30 for restricting the output current via the current restricting means 30 at a time point of supplying the polarization reversal state signal to the control terminal 15.

According to the embodiment, similar the first embodiment, when all of the single cells 1a, 1b, 1c of the fuel cell 1 normally generate power, the output of the protecting circuit 12 becomes the H level output.

On the other hand, when at least 1 piece of the single cells 1a, 1b, 1c of the fuel cell 1 is brought into the polarization reversal state, the output of the 3 inputs AND gate logical circuit 8 becomes L level. Further, when the output level of the 3 inputs AND gate logical circuit 8 is continued for 5 seconds or longer, the output of the protecting circuit 12 becomes L level and is supplied to the voltage increasing control circuit 11 as the polarization reversal state signal indicating the polarization reversal state. As a result, the voltage increasing control circuit 11 restricts the output supplied from the voltage increasing control circuit 11 to the external load 6 until the input of H level is provided. A deficient amount of the load current to the external load 6 produced by restricting the current is supplied by way of LIB3.

Figure 4:
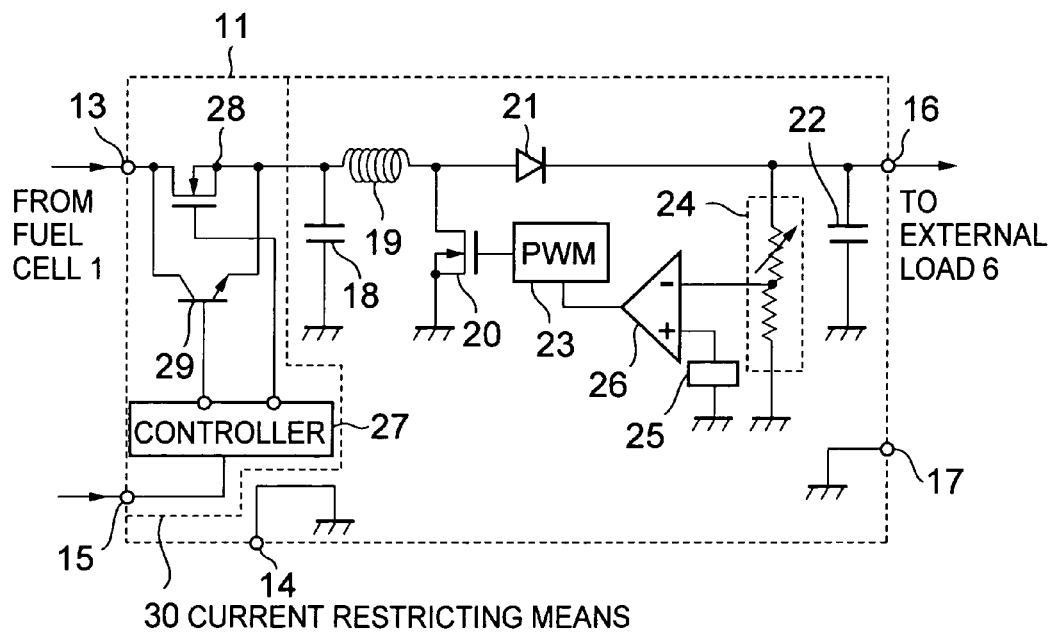
FIG. 4 is a circuit diagram showing a detailed example of a voltage increasing control circuit of FIG. 3.

FIG. 4 shows an example of a detailed constitution of the voltage increasing control circuit 11. According to the example, a switching regulator system is used as voltage increasing means. As the output of the fuel cell, energy is stored to an inductor 19 when N-chMOSFET 20 is brought into ON state. When N-chMOSFET 20 is brought into ON state, a current does not flow in a diode 21. When N-chMOSFET 20 is made OFF, energy stored to the inductor 19 is supplied to a smoothing condenser 22 and the external load 6 via the diode 21.

Here, the output voltage is determined by a rate of ON state to, OFF state of N-chMOSFET 20 by a PWM controlling circuit 23. The PWM controlling circuit 23 controls the rate such that an amount of voltage drop of the output of the voltage increasing control circuit 11 by a voltage diving resistor 24 and a reference voltage applied from a reference voltage generator 25 coincide with each other. Therefore, by changing a resistance rate of the voltage diving resistor 24, the output voltage can arbitrarily be set.

An input from the control terminal 15, that is, the polarization reversal state signal is inputted to a controller 27 for controlling the input current from the fuel cell 1.

When the signal inputted to the control terminal 15 of the voltage increasing control circuit 11 is H level, the controller 27 maintains N-chMOSFET 28 constituting switching means provided on an input side of the voltage increasing control circuit 11 to ON state and does not apply a bias to an NPN transistor 29. Therefore, all of the output of the voltage increasing control circuit 11 is supplied to the side of the external load 6 via N-chMOSFET 28. Therefore, it is preferable that N-chMOSFET 28 is MOSFET of low ON resistance. The output of the fuel cell 1 is inputted to the input voltage increasing circuit without restricting the output of the fuel cell 1 and therefore, when the fuel cell 1 normally generates power, a maximum output is provided.

On the other hand, when the signal inputted to the control terminal 15 of the voltage increasing control circuit 11 is L level, that is, when the polarization reversal state signal is supplied, the voltage increasing control circuit 11 controls to reduce the output current of the fuel cell 1. That is, the controller 27 lowers a potential of the gate of N-chMOSFET 28 to the ground and does not make the output current of the fuel cell 1 flow to N-chMOSFET 28.

Next, the controller 25 applies a bias to the base terminal of the NPN transistor 29 such that a current providing a maximum output of the fuel cell 1 is made to flow to the voltage increasing control circuit 11. Thereafter, the controller 27 gradually reduces a bias of the base terminal of the NPN transistor 29 and reduces the output current of the fuel cell 1.

When at a stage in the midst, a cell in the fuel cell 1 brought into the overload state is recovered to a normal output state and the signal inputted to the control terminal 15 becomes H level, the controller 27 fixes the bias applied to the base terminal of the NPN transistor 29.

On the other hand, when a signal at L level is supplied to the control terminal 15 in the state of fixing the bias applied to the base terminal of the NPN transistor 29, the controller 27 further reduces the applied bias until H level is inputted to the control terminal 15.

A state of inputting the output of the fuel cell 1 to the voltage increasing control circuit via the NPN transistor 29 is maintained until the external load 6 is nullified. Thereby, operation of the single cell of the fuel cell in the polarization reversal state can be prevented.

Further, the protecting circuit 12 of FIG. 3 may include a reference voltage generating circuit similar to that in FIG. 2. In this case, the current is restricted by detecting the overload state.

A fourth embodiment is a case of detecting a single cell brought into the polarization reversal or overload state by temperature of each single cell. That is, whereas according to the first through the third embodiments shown in FIG. 1 through FIG. 3, the generated voltages of the single cells are detected by way of the voltages across the both terminals of the respective single cells 1a, 1b, 1c, the embodiment differs therefrom in that the generated voltages are detected by way of temperatures of the respective single cells 1a, 1b, 1c. The other is constructed by a similar constitution. Hence, an explanation will be given by extracting only portions which differ from those of FIG. 1 through FIG. 3 and an explanation of duplicated portions will be omitted.

Figure 5:
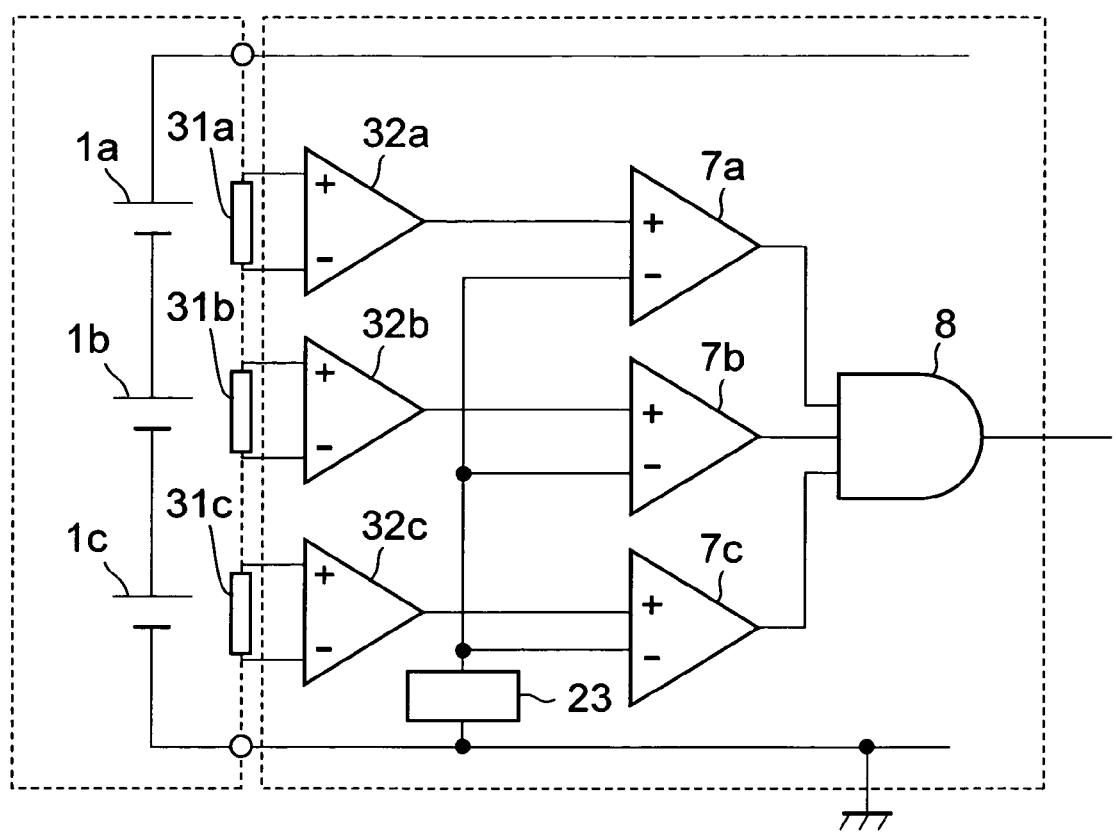
FIG. 5 is a block diagram of an abnormality detecting portion according to a fourth embodiment of the invention.

As shown by FIG. 5, a temperature of the fuel cell 1 for determining the polarization reversal or overload state is changed by members or structures constituting the fuel cell 1, in the case of a passive type unhumidified fuel cell 1 of PEFC, when a temperature of a vicinity of a cathode electrode exceeds 60° C., the film is started to be dried, the internal resistance of the fuel cell 1 is increased and an output characteristic of the fuel cell 1 is deteriorated. Further, even in the case in which the fuel cell 1 outputs a constant current, when the output characteristic is deteriorated by increasing temperatures of the respective single cells 1a, 1b, 1c, the fuel cell 1 is brought into a state equivalent to the overload state.

Hence, temperatures at vicinities of electrodes of the respective single cells 1a, 1b, 1c of the fuel cell are detected by temperature sensors 31a, 31b, 31c, and it is preferable to set detected values thereof as 45° C. through 110° C. For example, when the temperatures of the respective single cells 1a, 1b, 1c become equal to or higher than a set temperature between 45° through 110° C. by setting the reference voltage of the reference voltage generator 23, the overload state is determined. Further, as the temperature sensors 31a through 31c in this case, thermocouples or thermistors are preferable.

According to the embodiment, operation of the comparators 7a, 7b, 7c after at least 1 piece of the single cells 1a, 1b, 1c is brought into the overload state is quite similar to that in the cases of the first through the third embodiments.

According to the embodiment, outputs of the temperature sensors 31a, 31b, 31c are amplified by operational amplifiers 32a, 32b, 32c and inputted to the comparators 7a, 7b, 7c. However, it is not necessarily needed to form the constitution in this way and the outputs of the temperature sensors 31a, 31b, 31c may directly be inputted to the comparators 7a, 7b, 7c.

In a fuel cell system in which a temperature of a cell or a fuel is not controlled, the fuel cell 1 is not controlled to heat or cool and therefore, there is a correlation between generated heat and the output of the fuel cell in accordance with power generation. Therefore, by detecting the temperatures of the respective single cells 1a, 1b, 1c, the output state or the overload state of the fuel cell 1 can be detected. Therefore, it is not necessary to make a fuel flow, humidify or heat the fuel, heat the cell, or the like the fuel cell system is particularly effective for the passive type fuel cell system capable of grasping the output of the fuel cell 1 by detecting the generated heat of the fuel cell, at any rate, an abnormality of the generated voltage can be detected by detecting the temperatures of the single cells 1a, 1b, 1c and when an abnormal state is detected, the deterioration of the fuel cell 1 can be prevented beforehand similar to the first through the third embodiments by cutting the output or restricting the output current.

A fifth embodiment cuts output in accordance with detection of the polarization reversal or overload state and executes a positive recovering measure of the respective single cells 1a, 1b, 1c. Hence, portions thereof the same as those of FIG. 1 through FIG. 5 are attached with the same numerals and a duplicated explanation thereof will be omitted.

Figure 6:
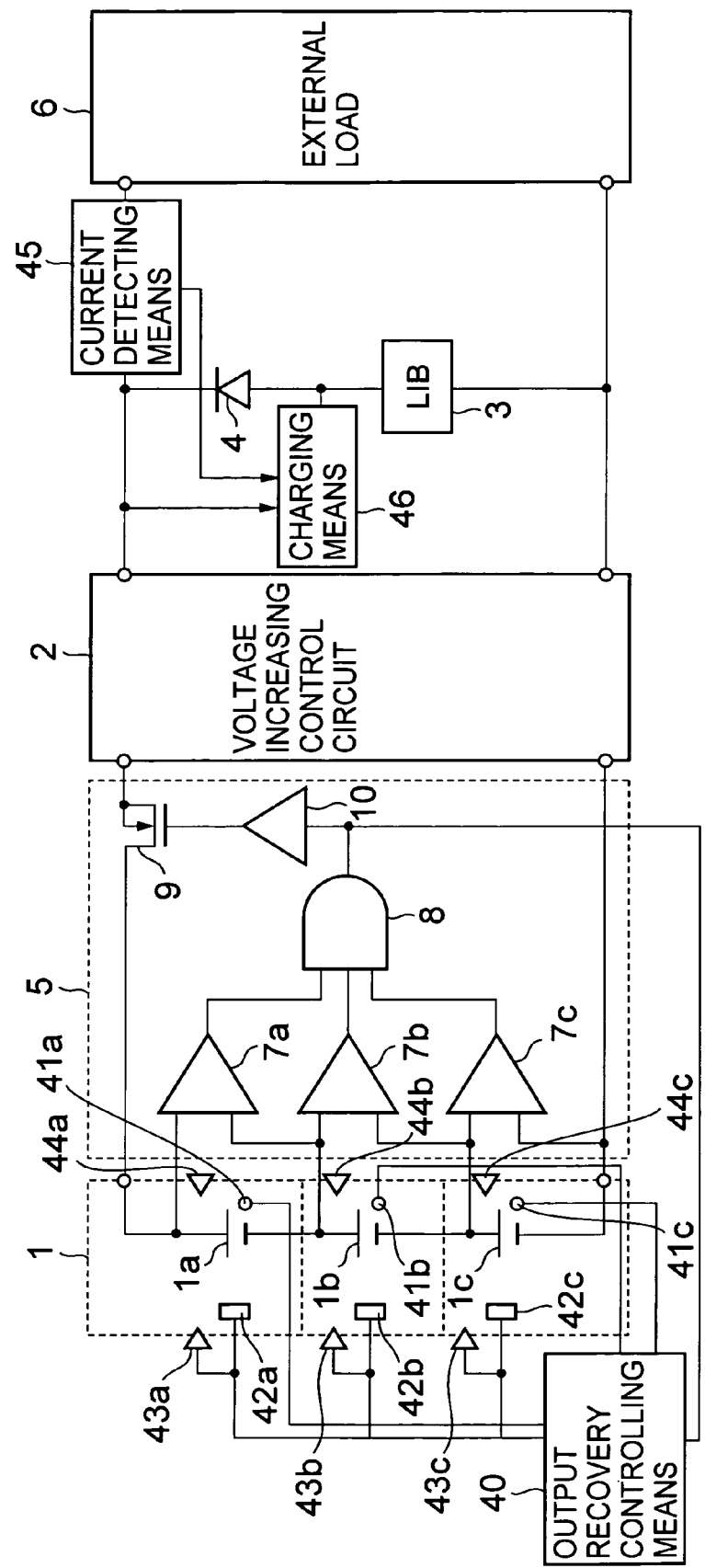
FIG. 6 is a block diagram of a fuel cell power source system according to a fifth embodiment of the invention.

As shown by FIG. 6, heaters 41a, 41b, 41c are arranged on sides of anode chambers of the respective single cells 1a, 1b, 1c. Here, the respective heaters 41a, 41b, 41c are provided with a function of evaporating to remove extra water produced at peripheries of the electrodes of the respective single cells 1a, 1b, 1c by heating. This is mainly for recovering the function of the respective single cells 1a, 1b, 1c by removing water constituting a hindrance of gas diffusion on a catalyst layer and a gas diffusing layer. It is preferable to set an upper limit temperature of heating in this case to 60 through 90° C.

Further, the respective single cells 1a, 1b, 1c are provided with pressure sensors 42a, 42b, 42c, purge valves 43a, 43b, 43c and safety valves 44a, 44b, 44c. The respective purge valves 43a through 43c are opened and closed by signals from output recovery controlling means 40. Further, according to the embodiment, supply of a fuel to the fuel cell 1 is cut by a signal from the output recovery controlling means 40.

The safety valves 44a through 44c for reducing pressure are adjusted to open when the anode chambers are brought under a pressure equal to or higher than the atmospheric pressure by 2.0 atmospheric pressure by adjusting spring pressures. Incidentally, preferably, the pressures are set between 1.0 through 3.0 atmospheric pressure. Here, the safety valves 44a through 44c using a bimetal can also be used. A temperature of opening the valves in this case is set to 80 through 100° C.

Although basically, the protecting circuit 5 is the same as that shown in FIG. 1, the polarization reversal or overload state signal constituting the output signal of the AND gate logical circuit 8 is transmitted to the driving circuit 10 as well as the output recovery controlling means 40.

Here, elements and apparatus related to the output recovery measure constitutes power sources thereof by LIB3 similar to the voltage increasing control circuit 2, the protecting circuit 5. On the other hand, as the power source of the elements and the apparatus related to the output recovery measure, the voltage increasing control circuit 2 and the protecting circuit 5, the fuel cell 1 can also be utilized. Further, current detecting means 45 for detecting a load current supplied to the external load 6 and charging means 46 for charging LIB3 are provided between the voltage increasing control circuit 2 according to the embodiment and the external load 6.

In this way, according to the embodiment, LIB3 is charged by operating the charging means 46 at a time point at which the current detecting means 45 detects that the load current to the external load 6 becomes null and charging is stopped at a time point at which the charging means 46 detects that LIB3 is brought into a fully charged state.

Further, there is no restriction at all in providing the current charging means 45 and the charging means 46 to the fuel cell systems shown in FIG. 1 through FIG. 3. Further, the fuel cell 1 according to the embodiment may be those of PEFC and DMFC having a dead end structure in which cells are planely connected in series and anode chambers of the cells are separated from each other as well as, for example, a fuel flow structure in which cells are planely connected and anode chambers are separated from each other, a fuel flow structure in which cells are planely connected and the anode chamber is common and a dead end structure and a stacking structure in which cells are planely connected and the anode chamber is common.

According to the embodiment having the above-described constitution, when all of the single cells 1a, 1b, 1c of the fuel cell 1 normally generate powers, the respective outputs of the comparators 7a, 7b, 7c become outputs of H level. The respective H level outputs of the comparators 7a, 7b, 7c are inputted to the 3 inputs AND gate logical circuit 8 and therefore, the output of the 3 inputs AND gate logical circuit 8 becomes H level. At this occasion, the driving circuit 10 turns on N-chMOSFET 9, the output of the fuel cell 1 is inputted to the voltage increasing control circuit 2 and power is supplied from the voltage increasing control circuit 2 to the external load 6.

On the other hand, when at least 1 piece of the single cells 1a, 1b, 1c of the fuel cell 1 is brought into the polarization reversal state, a negative voltage is outputted from any of the single cells 1a, 1b, 1c and an output of any one of the comparators 7a, 7b, 7c connected to the single cell 1a, 1b, 1c becomes L level. As a result, the output of the 3 inputs AND gate logical circuit 8 becomes L level since all of signal levels inputted thereto are not H level. When the output level of the 3 inputs AND gate logical circuit 8 is continued for 5 seconds or longer, the driving circuit 10 makes N-chMOSFET 9 OFF and maintains the state. Thereby, the output of the fuel cell 1 can be cut and therefore, power generation in the polarization reversal state can be avoided.

When the polarization reversal state signal constituting the L level signal from the 3 inputs AND gate logical circuit 8 is received, the output recovery controlling means 40 is operated simultaneously. When the output recovery controlling means 40 is operated, supply of fuel is cut and the anode chamber is brought into a hermetically closed space. Successively, liquid water in the anode chambers is vaporized by maintaining the anode chambers at 75° C. by the heaters 41a through 41c. When inner pressures of the anode chambers exceed 2.0 atmospheric pressure, the safety valves 44a through 44c are operated. As a result, the gas is discharged at any time.

When there is not a variation in the pressure for a predetermined time period (10 minutes according to the embodiment) by the pressure sensors 42a through 42c, the purge valves 43a through 43c are opened and closed within 2 seconds. By starting to supply fuel thereafter, normal power generation can be carried out in all of the single cells 1a, 1b, 1c.

Here, a timer is set for operation of the heaters 41a through 41c, and is set to cut the heaters 41a through 41c when the heaters are operated for 20 minutes.

When fuel supply is started, the protecting circuit 5 turns on N-chMOSFET 9 and electrically conducts the fuel cell 1 and the voltage increasing control circuit 2.

Further, although according to the embodiment, the fuel cell 1 is recovered by removing water produced at the single cells 1a, 1b, 1c by heating by the heaters, the embodiment is not limited thereto. Although it is useful as recovery measure to remove water at the vicinities of the electrodes, water can be removed also by constituting such that water is blown off by a blower or blowing a gas thereto. Further, other than the method of removing water, the following recovering means are conceivable. 1) Fuel in the anode chambers of the respective single cells 1a, 1b, 1c is forcibly circulated, 2) a gas in the anode chambers of the single cells 1a, 1b, 1c, is replaced, 3) the electrolysic film is humidified for humidifying the film and so on.

Further, there are conceivable a case of executing the recovery measure by constituting an object only by the single cell 1a, 1b, 1c at which the polarization reversal or overload state is detected, and a case of executing the recovery measure by constituting an object by all of the single cells 1a, 1b, 1c constituting the fuel cell 1 including the single cell 1a, 1b, 1c in which the polarization reversal or overload state is detected. It can easily be determined to select either thereof by determining, for example, the object of control by the output recovery controlling means 40.

However, when the recovery operation is executed for all of the single cells 1a, 1b, 1c, the following advantage is achieved. 1) States of the respective single cells 1a, 1b, 1c can be made to be uniform. 2) The outputs of the single cells 1a, 1b, 1c in which the polarization reversal is not detected is increased.

According to a sixth embodiment, not only the output current in accordance with detection of the polarization reversal or overload state is restricted but also positive recovery measure of the respective single cells 1a, 1b, 1c is executed. That is, the embodiment is a case of restricting a current instead of restricting the output current in accordance with detection of the polarization reversal or overload state according to the fifth embodiment shown in FIG. 6. Hence, portions the same as those in FIG. 1 through FIG. 6 are attached with the same numerals and a duplicated explanation thereof will be omitted.

Figure 7:
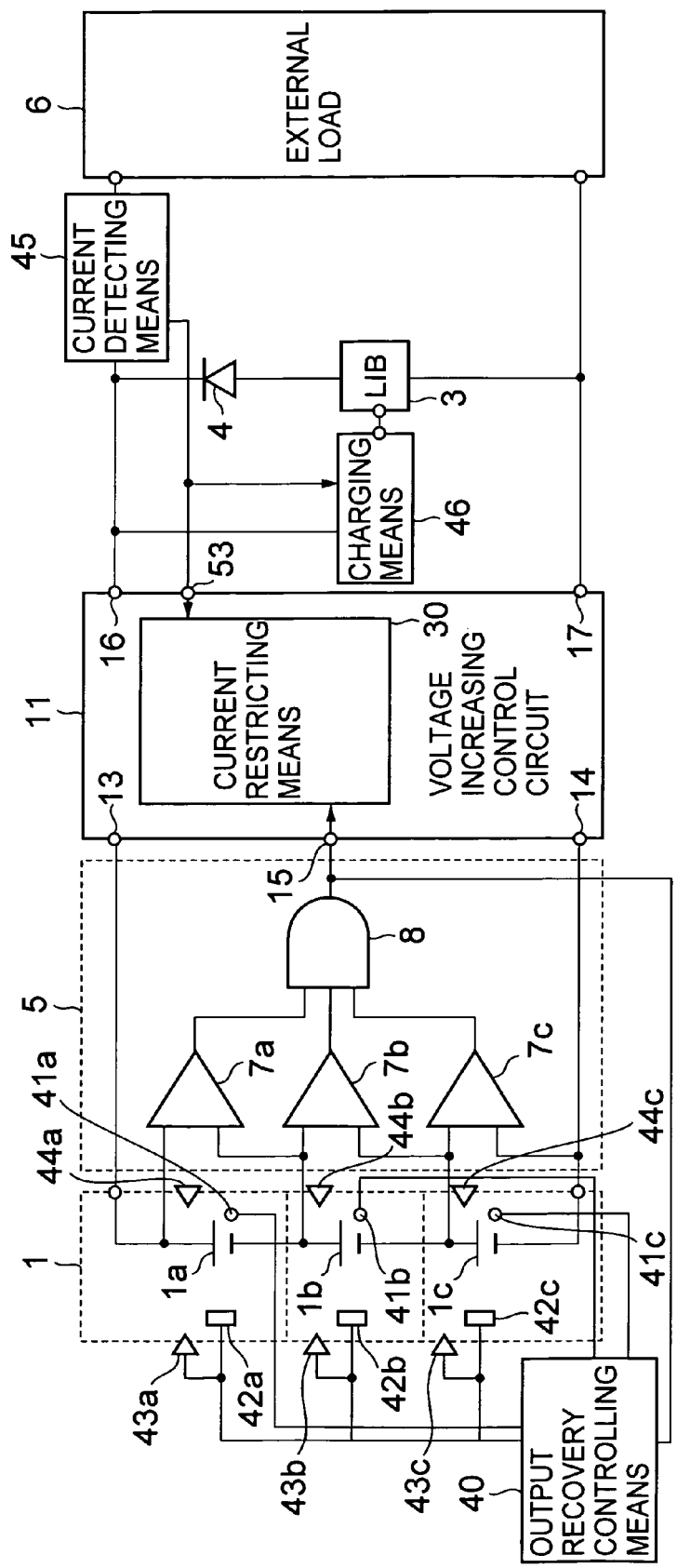
FIG. 7 is a block diagram of a fuel cell power source system according to a sixth embodiment of the invention.

As shown by FIG. 7, the embodiment is substantially similar to the fuel cell system shown in FIG. 3 except portions related to the recovery measure. However, according to the embodiment, the current controlling means 30 is reset when the current detecting means 45 detects null of the load current. Thereby, the current can smoothly be supplied to the succeeding external load 6.

Figure 8:
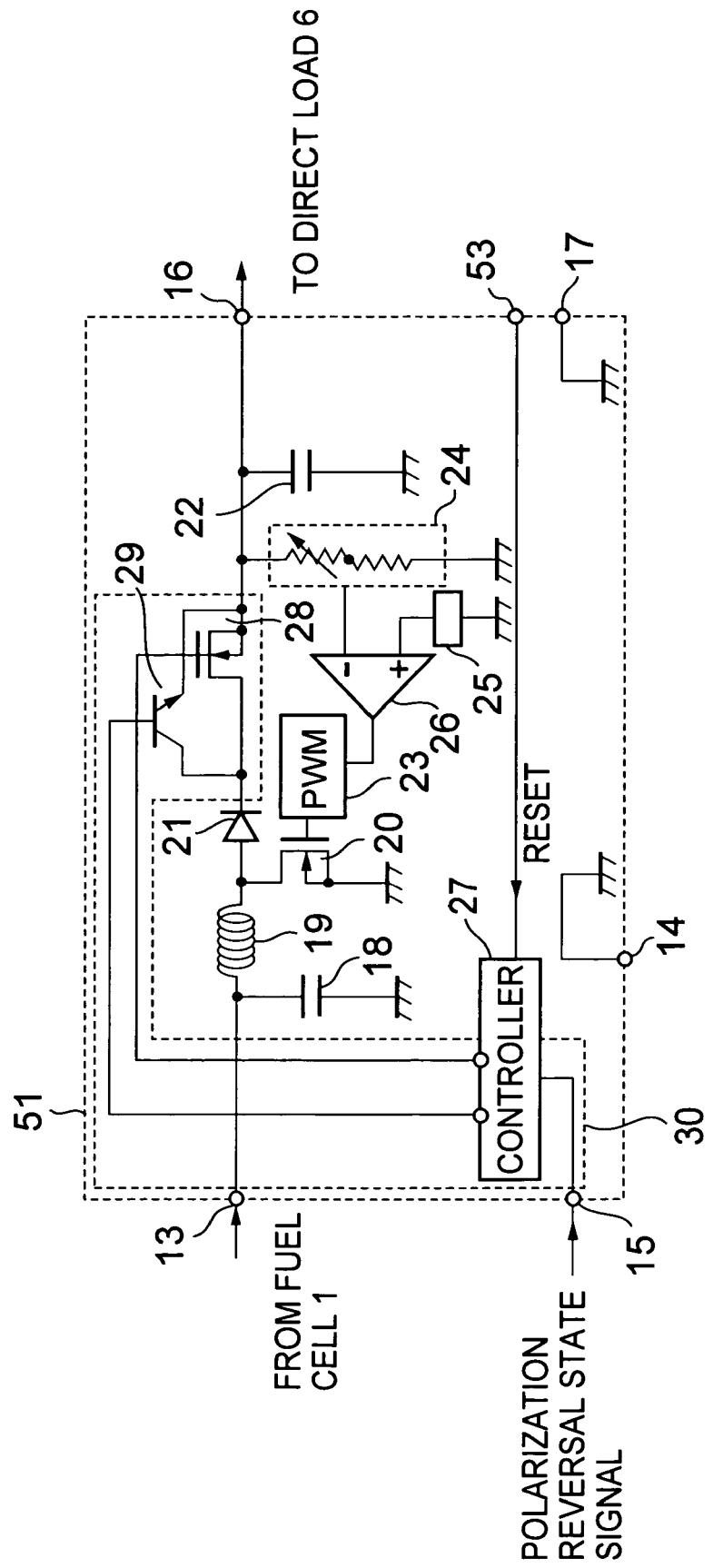
FIG. 8 is a circuit diagram showing a detailed example of a voltage increasing control circuit of FIG. 7.

FIG. 8 shows an example of a detailed constitution of a voltage increasing control circuit 51. Although the voltage increasing control circuit 51 is basically constructed by a constitution similar to the voltage increasing control circuit 11 shown in FIG. 4, the voltage increasing control circuit 51 differs therefrom in that the above-described function of resetting the current controlling means 30 is provided and a current on an output side of the voltage increasing control circuit 51 is controlled. That is, according to the example, the NPN transistor 29 is arranged on an output side thereof such that an output current of the voltage increasing control circuit 51 is controlled by the NPN transistor 29. That is, although the function per se of the controller 27 is similar, the controller 27 in this example controls the output current by way of the NPN transistor 29 on the output side.

Although restriction of the current does not essentially differ by restricting the current by either the input side or the output side, in the voltage increasing control circuit 51, it is preferable to control the current on the output side having a higher voltage. It is because that the current can be controlled easily and highly accurately. Therefore, in the case of a voltage reducing control circuit, it is preferable to control a current on the input side.

In this example, a resetting signal from the current detecting means 45 is supplied to the controller 27 of the current controlling means 30 via a terminal 53. Other operation is quite similar to that in the case of FIG. 4.

According to a seventh embodiment, the protecting circuit further includes a counter for counting the number of times of bringing the respective single cells into the polarization reversal or overload state and cuts the output of the fuel cell when the state of bringing the same single cell into the polarization reversal or overload is detected continuously by a specified number of times or more. Although the embodiment includes output recovering means, naturally, it is not necessary that the embodiment includes the output recovering means. The embodiment can be combined with any means so far as the means cuts the output when the polarization reversal or overload state is detected. Further, portions the same as those of FIG. 1 through FIG. 8 are attached with the same numerals and a duplicated explanation thereof will be omitted.

Figure 9:
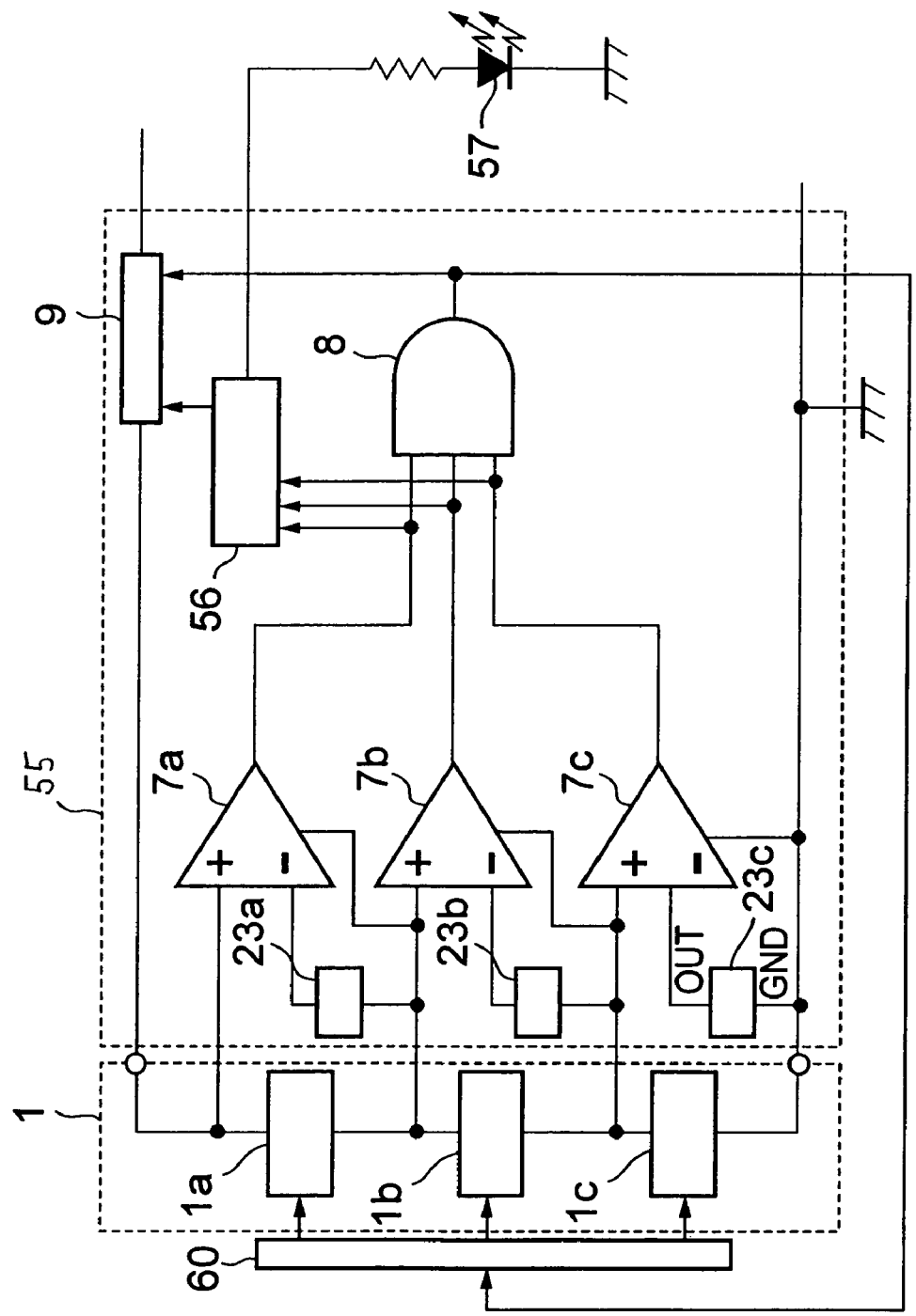
FIG. 9 is a block diagram of an abnormality detecting portion according to a seventh embodiment of the invention.

As shown by FIG. 9, a protecting circuit 55 includes a counter 56 for branching to input output signals of the comparators 7a, 7b, 7c inputted to the 3 inputs AND gate logical circuit 8. The counter 56 counts the number of times of continuously bringing about the polarization reversal or overload state with regard to respective single cells 1a, 1b, 1c and when a result of counting exceeds a predetermined number of times (for example, 20 times), the output of the fuel cell 1 is cut by making N-chMOSFET 9 constituting the switching means OFF. At the same time, a light emitting diode (hereinafter, LED) 57 is made to emit light to display error.

Meanwhile, according to the embodiment, reference voltage generators 23a, 23b, 23c are provided in correspondence with the respective comparators 7a, 7b, 7c and a reference voltage (for example, 0.3 V) is applied to the respective reverted terminals. Although by providing the reference voltage generators 23a, 23b, 23c individually in this way, the number thereof is increased, the reference voltage more accurate than that in the case shown in FIG. 2 and the like can be supplied to the respective comparators 7a, 7b, 7c. Output recovering means 60 is integrated with portions related to the output recovery measure and is a concept including, for example, the output recovery controlling means 40, the heaters 41a through 41c, the pressure sensors 42a through 42c, the purge valves 43a through 43c and the safety valves 44a through 44c of FIG. 7.

Further, even when the 3 inputs AND gate logical circuit 8 detects the polarization reversal or overload state, the output of the fuel cell 1 can be cut separately therefrom by making N-chMOSFET 9 constituting the switching means OFF.

According to the embodiment, by controlling the number of times of continuously detecting the polarization reversal or overload state, an operation efficiency of the fuel cell system can be maintained as highly efficient as possible and at the same time, the single cell brought into the polarization reversal or overload state can pertinently be protected by cutting the output of the fuel cell in accordance with detection of the polarization reversal or overload state. Here, the output recovering means 60 executes a predetermined output recovery measure at each time of detecting the polarization reversal or overload state by the 3 inputs AND gate logical circuit 8.

According to an eighth embodiment, the protecting circuit further includes counting means for counting the number of times of bringing the respective single cells into the polarization reversal or overload state and restricts the output current of the fuel cell when the protecting circuit detects the polarization reversal or overload of the same single cell continuously by a specified number of times or more. Although the embodiment includes output recovering means, naturally, it is not necessary that the embodiment includes the output recovering means. The embodiment can be combined with any means so far as the means restricts the current when the polarization reversal or overload state is detected. Further portions the same as those in FIG. 1 through FIG. 9 are attached with the same numerals and a duplicated explanation thereof will be omitted.

Figure 10:
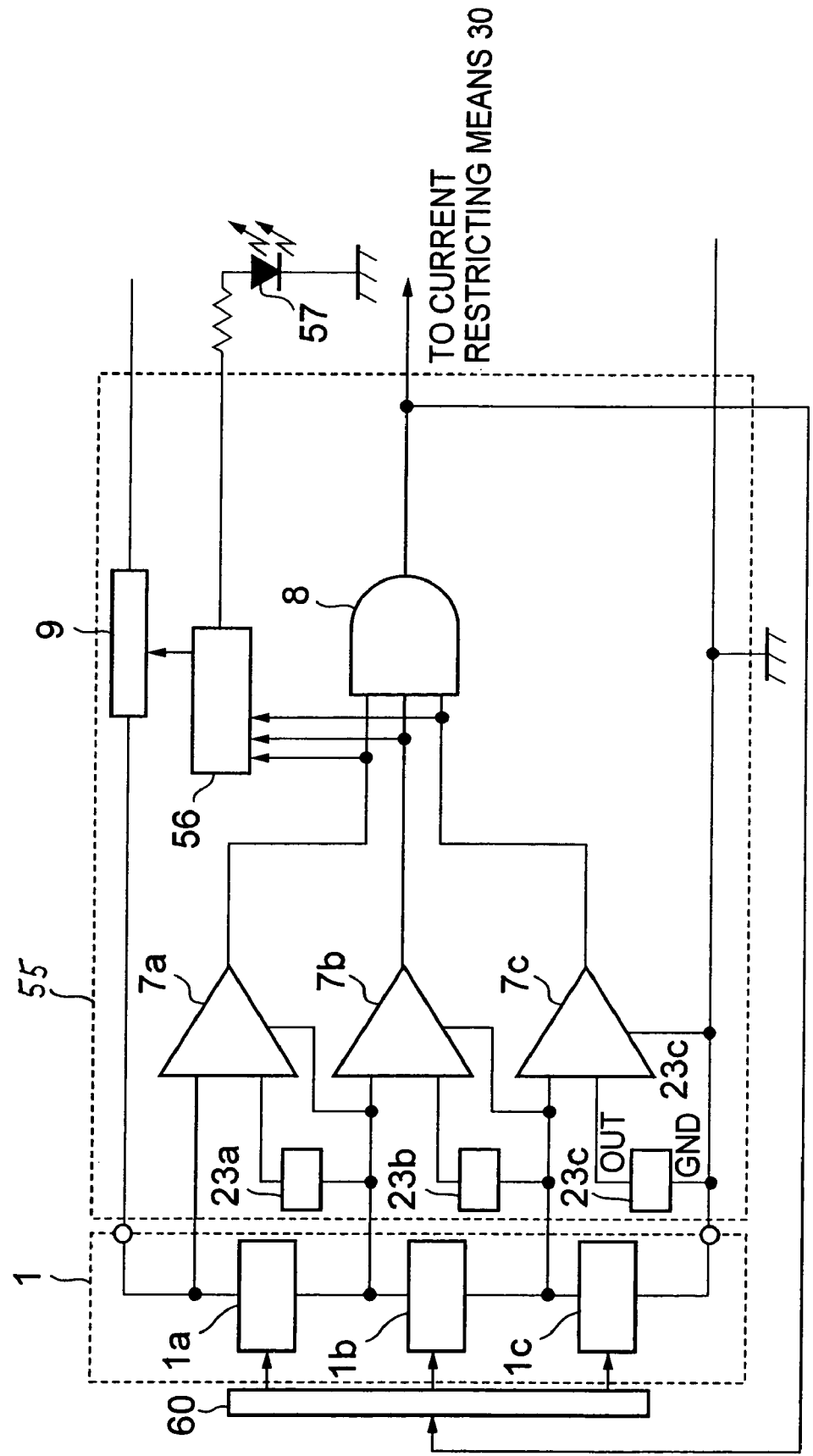
FIG. 10 is a block diagram of an abnormality detecting portion according to an eighth embodiment of the invention.

As shown by FIG. 10, a protecting circuit 55 includes the counter 56 for branching to input output signals of the comparators 7a, 7b, 7c inputted to the 3 inputs AND gate logical circuit 8. The counter 56 counts the number of times of continuously bringing about the polarization reversal or overload state with regard to respective single cells 1a, 1b, 1c and when a result of counting exceeds a predetermined number of times (for example, 20 times), the output of the fuel cell 1 is cut by making N-chMOSFET 9 constituting the switching means OFF. At the same time, the light emitting diode (hereinafter, LED) 57 is made to emit light to display error.

Meanwhile, according to the embodiment, the reference voltage generators 23a, 23b, 23c are provided in correspondence with the respective comparators 7a, 7b, 7c and a reference voltage (for example, 0.3 V) is applied to the respective reverted terminals. Although by providing the reference voltage generators 23a, 23b, 23c individually in this way, the number thereof is increased, the reference voltage more accurate than that in the case shown in FIG. 2 and the like can be supplied to the respective comparators 7a, 7b, 7c.

The output recovering means 60 is integrated with portions related to the output recovery measure and is the concept including, for example, the output recovery controlling means 40, the heaters 41a through 41c, the pressure sensors 42a through 42c, the purge valves 43a through 43c and the safety valves 44a through 44c of FIG. 7.

According to the embodiment, by controlling the number of times of continuously detecting the polarization reversal or overload state, the operation efficiency of the fuel cell system can be maintained as highly efficient as possible and at the same time, the single cell brought into the polarization reversal or overload state can pertinently be protected by cutting the output of the fuel cell in accordance with detection of the polarization reversal or overload state.

Here, the output recovering means 60 executes a predetermined output recovery measure at each time of detecting the polarization reversal or overload state by the 3 inputs AND gate logical circuit 8. Similarly, also the current is restricted by operating the current restricting means 30 by a polarization reversal or overload state signal.

Figure 11:
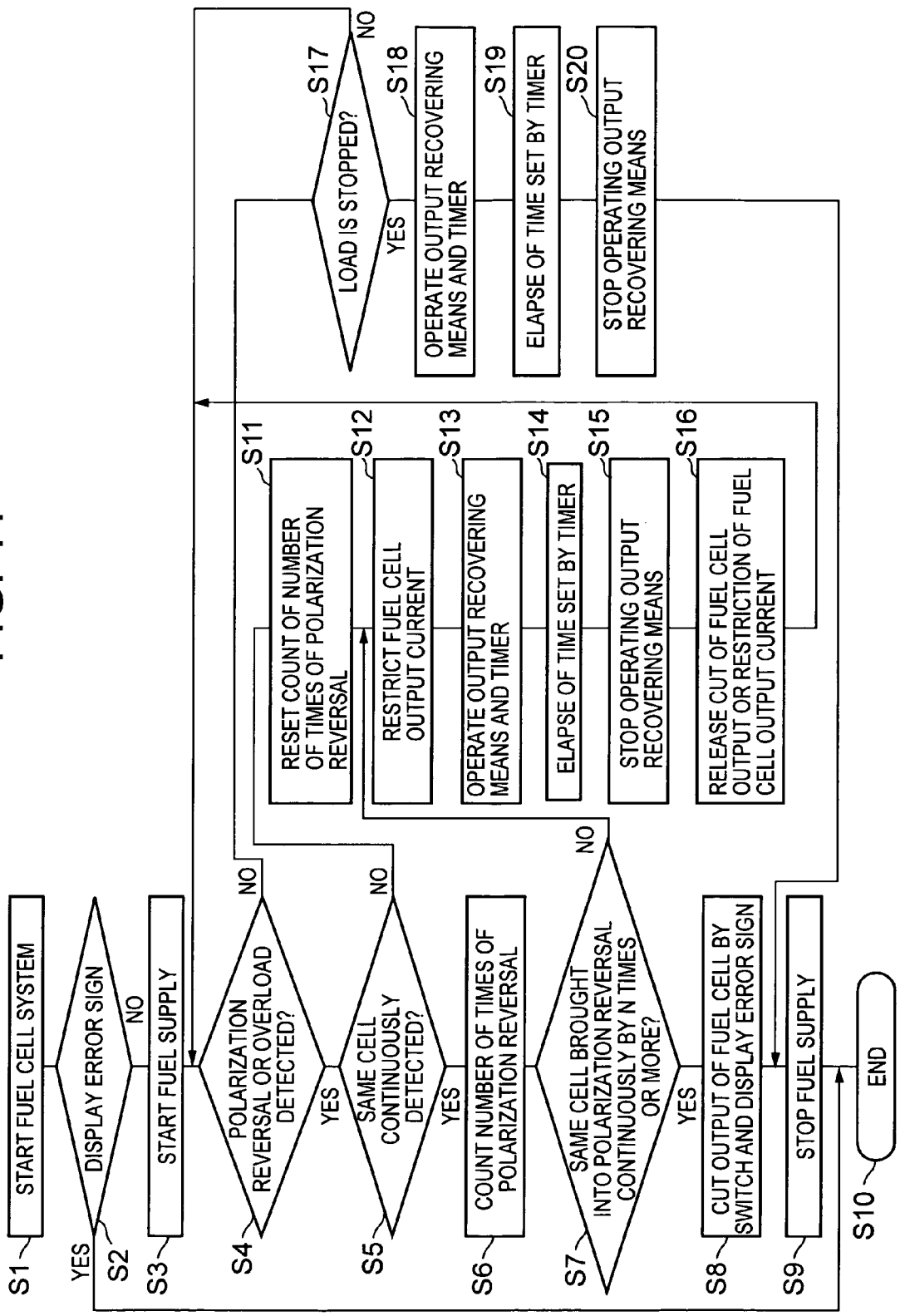
FIG. 11 is a flowchart for explaining operation of FIG. 10.

FIG. 11 is a flowchart showing an example of operation flow of the fuel cell system according to the embodiment.

The fuel cell 1 is PEFC having 3 pieces of the single cells 1a, 1b, 1c and a cathode side thereof is of an atmosphere open type. The fuel cell 1 includes a fuel supply route, not illustrated, and anode chamber sides of the respective single cells 1a, 1b, 1c are provided with the pressure sensors 42a, 42b, 42c and the purge valves 43a, 43b, 43c. The purge valves 43a, 43b, 43c are brought into an open state when inner pressures of the anode chambers become 1.5 atmospheric pressure or higher by the pressure sensors 42a, 42b, 42c.

As output recovering means, the heaters 41a, 41b, 41c are used which are arranged at insides of the anode chambers of the respective power generating cells. Power sources of the heaters 41a, 41b, 41c are provided from the output of the fuel cell 1. In the protecting circuit 55, abnormality detecting means is constituted to be able to detect the overload state and a reference voltage of voltage reference is set to 0.3 V.

The counter 56 is constituted to add count when the abnormality detecting means continuously detects the overload state of the same single cell 1a, 1b, 1c. When the number of times of counting exceeds 20 times, a signal of making the switch 9 OFF is applied thereto and a voltage is applied to LED 57 to make LED 57 emit light to constitute an error sign.

Here, operation in operating the fuel cell system will be explained in reference to FIG. 11.
1) The fuel cell system is started in order to operate the external load 6 (step S1), and when an error sign is lighted at step S2, the operation proceeds to step S10 to finish operating.
2) When the error sign is not lighted at step S2, at step S3, the fuel is supplied to the fuel cell 1 and power generation is started.
3) At step S4, when the overload state of the single cell 1a, 1b, 1c is detected by the abnormality detecting means, the operation proceeds to step S5 and it is determined whether the cell is the same as the single cell 1a, 1b, 1c the overload of which has been detected at a preceding time.
4) When the cell is the same as the cell 1a, 1b, 1c the overload of which has been detected at a preceding time, the operation proceeds to S6 to add count.
5) When the count number is a set number of times, or 20 times or higher in this case at step S7, the operation proceeds to step S8. At step S8, a switch 9 is made OFF for cutting the output of the fuel cell system to light LED 57.
6) Next, at step S9, supply of the fuel is stopped and power generation is finished (step S10).
7) On the other hand, when the count number is equal to or smaller than the set number of times, or 20 times in this case at step S7, the operation proceeds to step S12 to restrict the output current of the fuel cell system.
8) Next, at step S13, the heater 41a, 41b, 41c constituting the recovering means is driven and the timer is operated. A set time period of the timer is set to 15 minutes.
9) After operating the output recovering means 60 for 15 minutes (step S14) and the output recovering means 69 stops operating (step S15).
10) Next, at step S16, restriction of the output current of the fuel cell is released and the operation returns to step S4.
11) Here, at step S5, when the cell overload of which is detected is not the single cell 1a, 1b, 1c the overload of which has been detected at a preceding time, the operation proceeds to step S11, resets the counter 56 and proceeds to step S12. The above-described processings are executed from step S12 to step S16.
12) At step S4, when the overload is not detected, the operation proceeds to step S17. Here, when the load is not stopped, the operation returns again to the processing of step S4.
13) At step S17, when the load is stopped, the output recovering means 60 and the timer are operated (step S18), when a time period set by the timer (15 minutes in this case) has elapsed (step S19), the output recovering means 60 is stopped (step S20).
14) Thereafter, at step S9, supply of the fuel is stopped and the operation is finished (step S10).

Further, in the case of the seventh embodiment of cutting output in the polarization reversal or overload state, at step S12 and step S16, "the output of the fuel cell is cut".

Ninth Embodiment

A ninth embodiment includes switching means for short-circuitting both terminals of the respective single cells and is constituted such that when the polarization reversal or overload state is detected, both terminals of the single cell brought into the state is shortcircuitted by the switching means. Portions the same as those in FIG. 1 through FIG. 10 are attached with the same numerals and a duplicated explanation thereof will be omitted.

Figure 12:
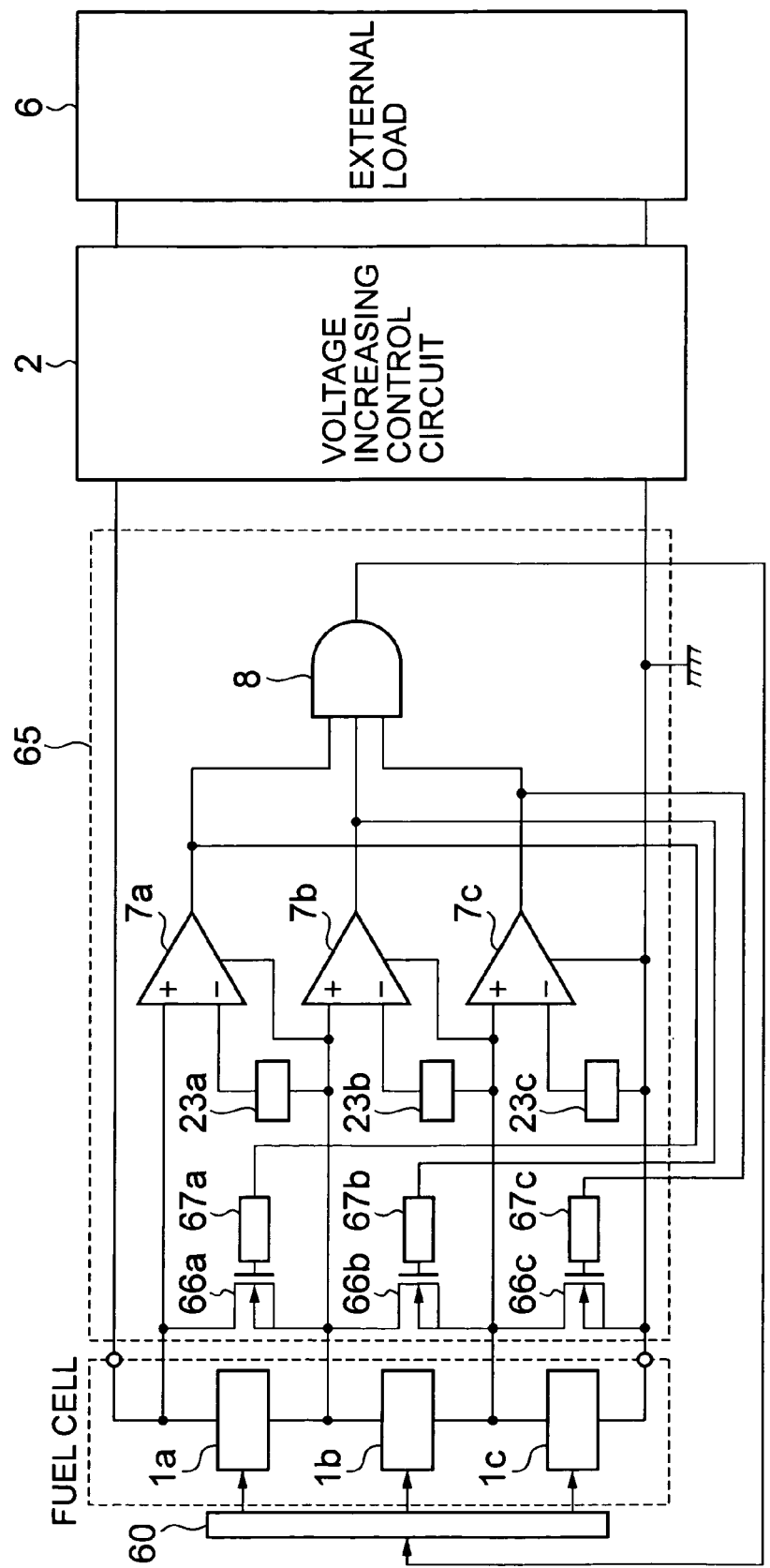
FIG. 12 is a block diagram of an abnormality detecting portion according to a ninth embodiment of the invention.

As shown by FIG. 12, in a fuel cell system according to the embodiment, in order to detect the overload state, the comparators 7a, 7b, 7c are made to correspond to the respective single cells 1a, 1b, 1c, the unreverted input terminals of the respective comparators 7a, 7b, 7c are connected to positive poles of the respective single cells 1a, 1b, 1c, and the reference voltage generators 23a, 23b, 23c for voltage reference are interposed to connect between negative poles of the respective single cells 1a, 1b, 1c and the reverted input terminals of the respective comparators 7a, 7b, 7c. GND terminals of the respective comparators 7a, 7b, 7c and the reference voltage generators 23a, 23b, 23c are connected to the negative poles of the single cells 1a, 1b, 1c in correspondence therewith.

By inputting the outputs of the respective comparators 7a, 7b, 7c to the 3 inputs AND gate logical circuit 8, the respective generated power voltages of the single cells 1a, 1b, 1c become equal to or lower than a voltage set by the reference voltage in correspondence therewith, and the polarization reversal or overload state signal is transmitted. That is, in accordance with reversing the outputs of the respective comparators 7a, 7b, 7c, also the output of the 3 inputs AND gate logical circuit 8 is reversed. As a result, the overload state is detected.

On the other hand, the respective single cells 1a, 1b, 1c are connected in parallel with N-channel EFTs 66a, 66b, 66c constituting switching elements by connecting cathode sides of the respective single cells 1a, 1b, 1c and drain terminals of the N-channel EFTs 66a, 66b, 66c.

Here, although the N-channel EFTs 66a, 66b, 66c are normally brought into an OFF state, when the polarization reversal or overload state is detected from a certain single cell 1a, 1b, 1c, a signal is supplied from an output terminal of the comparator 7a, 7b, 7c in correspondence with the single cell 1a, 1b, 1c brought into the polarization reversal or overload state to a driver 67a, 67b, 67c of the N-channel EFT 66a, 66b, 66c for bypassing in correspondence with the single cell 1a, 1b, 1c brought into the polarization reversal or overload state. When the driver 67a, 67b, 67c receives the polarization reversal or overload state signal, the N-channel EFT for bypassing is maintained in an ON state by a time period set by the operation timer of the output recovering means 60 and the output current of the fuel cell 1 is bypassed from the single cell 1a, 1b, 1c brought into the polarization reversal or overload state.

At the same time, when the polarization reversal or overload state of the fuel cell 1 is detected by the abnormality detecting means, the output recovering means 60 of the fuel cell 1 is operated based on the polarization reversal or overload signal constituting the output signal of the 3 inputs AND gate logical circuit 8. The output recovering means 60 is controlled to operate by the timer and stops operating when a time period set by the timer has elapsed.

In this way, according to the embodiment, a generated power current of the fuel cell 1 is made to flow by detecting the polarization reversal or overload state and bypassing a failed cell.

Further, in order to excellently detect the polarization reversal, the positive poles of the respective single cells 1a, 1b, 1c may be connected with the unreverted input terminals of the respective comparators 7a, 7b, 7c and the negative poles of the respective cells may be connected with the reverted input terminals and the GND terminals of the comparators. Thereby, at any position of the single cells 1a, 1b, 1c connected in series, the polarization reversal can positively be detected and utilized.

According to the embodiment, the single cell in which the polarization reversal or overload is detected is bypassed by the N-channel EFT 66a, 66b, 66c and recovery of the polarization reversal or overload state can be achieved while supplying the current by the remaining single cells.

Although as described above, there have been disclosed respective pluralities of kinds of the abnormality detecting circuits for detecting the polarization reversal or overload state, the protecting circuits, the current restricting means, the voltage increasing control circuits, the electricity storing means, the output recovering means and the like through the respective embodiments, the respective elements can freely be combined. Although all of the combinations are not disclosed, all of derived combinations are included in the technical thought of the invention.

Further, a charging element of LIB3 or the like is not indispensable. Although when the charging element is included, there is achieved an advantage of capable of supplying power continuously to the external load 6 when the fuel cell 1 is brought into the polarization reversal or overload state, it is not necessarily needed that the charging element is integral with the fuel cell system. In the same meaning, also the voltage increasing control circuit does not constitute an indispensable constituent condition.

The fuel cell system of the invention can prevent corrosion and a deterioration in an output characteristic of a fuel cell in order to prevent operation of the fuel cell in an overload state. Prevention of power generation of the fuel cell in a deteriorated mode and an initial power generating function of a single cell of the fuel cell are maintained and the power can be supplied stably. The fuel cell system can adapt to small-sized formation of a fuel cell system for a portable apparatus since a mode in a simple constitution can be provided.

What is claimed is:

1. A fuel cell system comprising:
    a fuel cell stack constituted by at least two single cells connected in series;
    protecting means for transmitting a polarization reversal or an overload state signal indicating a polarization reversal or an overload state when the polarization reversal or overload state is detected by abnormality detecting means for detecting power generation of the respective single cells in the polarization reversal or the overload state, the protecting means including counting means for counting a number of times a polarization reversal state or an overload state is detected for the same single cell, and switching means for switching off the output current of the fuel cell stack when the counted number for the same single cell exceeds a predetermined number; and state;
    current restricting means operative in response to the polarization reversal or the overload state signal for gradually reducing an output current of the fuel cell stack.

2. A fuel cell system according to claim 1; wherein the protecting means determines the polarization reversal or the overload state when a voltage across the both terminals of each of the single cells is equal to or smaller than a predetermined value.

3. A fuel cell system according to claim 1; wherein the protecting means determines the polarization reversal or the overload state when a temperature of an electrode of each the single cells is equal to a predetermined value or higher.

4. A fuel cell system according to claim 1; wherein the current restricting means gradually reduces the output current from a maximum output current of the fuel cell.

5. A fuel cell system according to claim 1; further comprising current detecting means for detecting the output current supplied to an external load;
    wherein the current restricting means operates to reset at a time point of nullifying the output current detected by the current detecting means.

6. A fuel cell system according to claim 1; wherein the protecting means includes resetting means for resetting the counting means when a polarization reversal or an overload is detected for another single cell within the fuel cell stack.

* * * * *